United States Patent [19]

Guidoux

[11] 4,229,825
[45] Oct. 21, 1980

[54] SYNCHRONIZING CIRCUIT FOR A DIGITAL ARRANGEMENT

[75] Inventor: Loic B. Y. Guidoux, Le Plessis Robinson, France

[73] Assignee: Telecommunications Radioelectriques et Telephoniques T.R.T., Paris, France

[21] Appl. No.: 960,369

[22] Filed: Nov. 13, 1978

[30] Foreign Application Priority Data

Dec. 28, 1977 [FR] France .................. 77 39424

[51] Int. Cl.$^3$ .................................. H04L 25/40
[52] U.S. Cl. .................................. 375/118; 370/108
[58] Field of Search .................. 179/69.1, 15 BS; 328/155

[56] References Cited

U.S. PATENT DOCUMENTS 3,188,569  6/1965  Mahoney .................. 178/69.1

*Primary Examiner*—Benedict V. Safourek
*Attorney, Agent, or Firm*—Thomas A. Briody; Jack Oisher; James J. Cannon, Jr.

[57] ABSTRACT

A circuit for the synchronization of the operating cycles of a digital arrangement with an external clock signal which arrangement includes a calculating unit and a circulating store which must produce a sequence of coefficients in a predetermined order at each cycle. The circuit has switching means for circulating the coefficients in the store either in series or word-by-word, means for producing a word clock, means for forming operating cycles synchronous with the word clock and for starting each operating cycle at each characteristic transition of the external clock signal appearing after the end of each cycle. The switching means are controlled to have the sequence of coefficients circulate in series once in each cycle and for having the coefficients circulate word-by-word for the remaining period of time.

5 Claims, 4 Drawing Figures

SYNCHRONIZING CIRCUIT FOR A DIGITAL ARRANGEMENT

BACKGROUND OF THE INVENTION

1. Field of the Invention

The invention relates to a circuit for synchronizing a digital arrangement with an external clock pulse signal, the digital arrangement comprising a calculating unit receiving during each one of its cycles to be synchronized with the exteral clock pulse signal both an external information to be entered into a buffer store and, thereafter, a sequence of coefficients originating in a predetermined order from a circulating store formed by a number of shift registers equal to the number of coefficients, these shifts registers being shifted by pulses derived from a main clock pulse generator.

2. Description of the Prior Art

The problem of synchronizing a digital arrangement of this type with an external clock pulse signal is, for example, encountered in a digital receiver for a data transmission system. In this case the relevant digital arrangement may be an auto-adaptive passband or baseband equalizer which, as known, processes the received data by means of the automatically adjusted coefficients to compensate for the effects of the distortions of the transmission channel.

In this example, the receiver includes a clock recovery circuit to derive from the received data signal an external clock pulse signal in synchronism with the clock frequency of the data. The received data are coded in the rhythm of the external clock and transferred to a buffer store. During data transmission the equalizer operates correctly if, after each characteristic transition of the external clock pulse signal, an operating cycle of constant duration for the calculating unit is started, each cycle comprising a first time interval for entering an external information into the buffer store and a second time interval for directing the sequence of the coefficients stored in the circulating store to the calculating unit, which coefficients must appear in a predetermined order, that is to say beginning with a first predetermined coefficient and ending with a last predetermined coefficient.

This synchronization of the operating cycles of the calculating unit poses a problem which has not been solved so far in a satisfactory manner if the use of dynamic shift registers in the circulating store is desirable. It is known that these registers must be continuously supplied with shift pulses as otherwise the stored information may get lost.

The known synchronizing circuits utilize a circulating store implemented in a conventional manner with registers arranged in cascade to form a loop so that, if the registers are continuously supplied with shift pulses, the sequence of coefficients appears continuously at the output of the circulating store. To have the sequence of coefficients appear in the required predetermined order in each operating cycle of the calculating unit a shorter or longer interruption in the shift pulses cannot be avoided. In a known circuit, for example, the shift pulses are interrupted at the end of each cycle, that is to say when the last coefficient of the sequence of coefficients has appeared, and they are restored at the beginning of the next cycle to have the first coefficient of the sequence appear at once. Therefore an interruption of the shift pulses is produced in such a circuit between each cycle during the data transmission and in order to acquire synchronization for a new transmission, the duration of the interruption may reach a value in the order of magnitude of one clock period of the data.

SUMMARY OF THE INVENTION

It is an object of the present invention to provide a synchronizing circuit to effect and maintain the synchronization without interrupting the shift pulses to the registers of the circulating store, so that dynamic registers which notably have the advantage of being very suitable for an easy large scale integration, can be used.

In accordance with the invention this synchronizing circuit comprises switching means included in the circulating store for having the coefficients circulate either in series in the cascade-connected registers or word by word, each coefficient circulating in a register, means for deriving from the main clock a word clock corresponding to duration of circulation of a coefficient in a register, means for forming, in synchronism with the word clock, operating cycles of constant duration for the calculating unit and a read signal for the buffer store at the beginning of each cycle, each cycle being started by a transition detection circuit arranged for detecting at the occurrence of a word clock pulse the characteristic transition of the external clock pulse signal appearing after the end of each cycle, said switching means being controlled so that the coefficients circulate word-by-word from the end of each cycle to the instant at which within the next cycle the buffer store having been read has ended and that thereafter said sequence of coefficients circulates in series until the end of the next cycle.

As the circuit according to the invention also offers the advantage of a high-speed synchronization and a simple adaptation to the external clock frequency, it may be advantageous to use it even if the circulating store is implemented with the aid of static flipflop registers.

BRIEF DESCRIPTION OF THE DRAWINGS

An embodiment of the invention will now be described in greater detail, by way of example, with reference to the accompanying drawings.

DESCRIPTION OF THE PREFERRED EMBODIMENT

Figure 1:
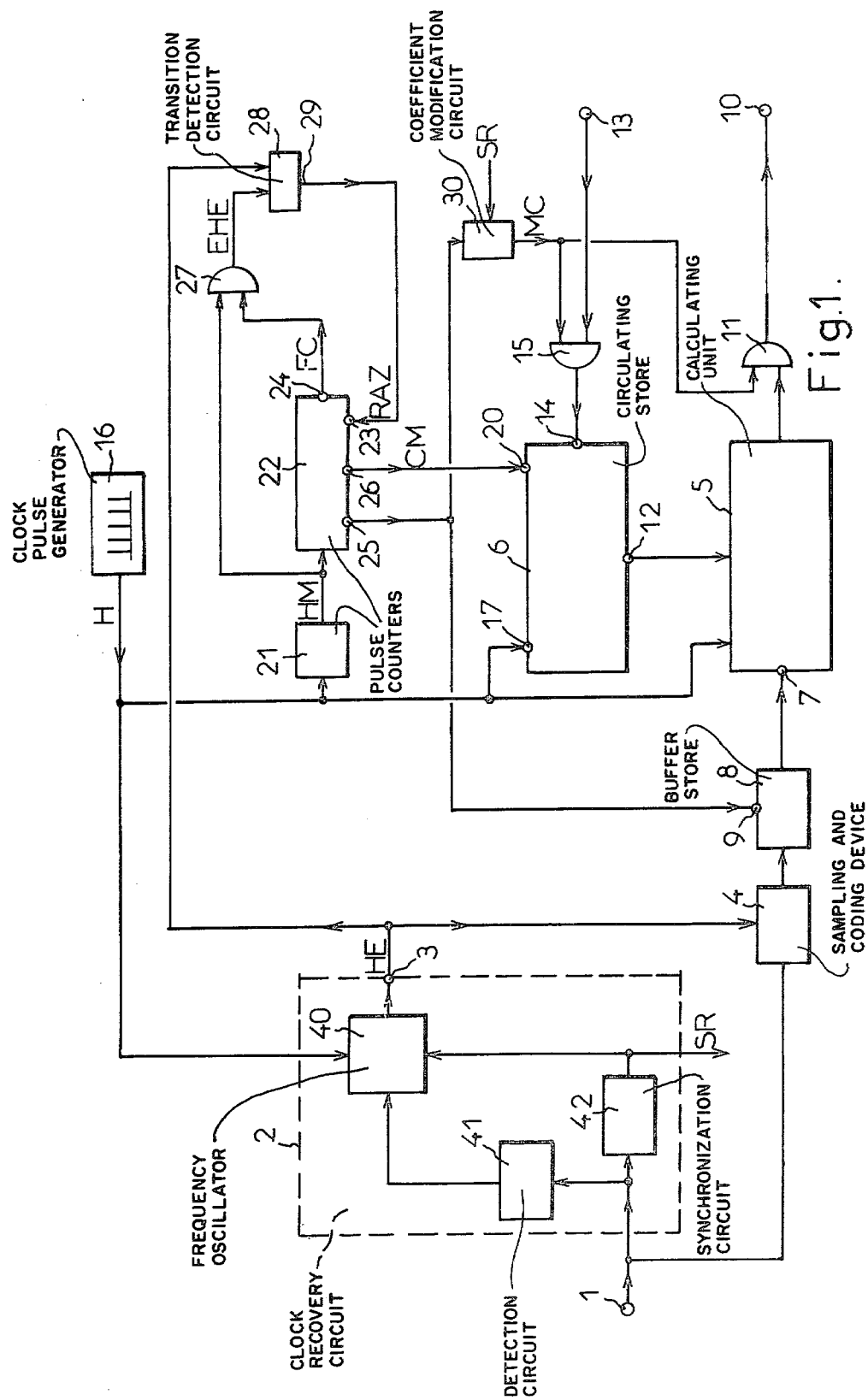
FIG. 1 shows a circuit diagram of the synchronizing circuit according to the invention.

The block diagram of FIG. 1 shows the synchronizing circuit according to the invention in the case, given by way of example, that it is included in a receiver of a data transmission system. The data signals transmitted by the remote transmitter appear at an input terminal 1 of the receiver. This received data signal is applied to a clock recovery circuit 2 for recovering the data clock as used in the transmitter, which recovery circuit 2 continuously produces an external clock pulse signal HE at its output terminal 3, said external clock pulse signal becoming synchronous to the data clock during the data transmission. The frequency of this external clock is, for example, 2400 Hz for a transmission at a speed of 2400 baud. The data signal received in analog form is also applied to a sampling-and-coding device 4 operating in the rhythm of the external clock and providing, in this rhythm, coded samples of the received data signal, generally denoted external digital information. This external digital information is processed in a digital arrangement which is, for example, in the above-mentioned case a known auto-adaptive line equalizer and comprises a calculating unit 5 and a circulating store 6 for storing the coefficients to be used in the calculating unit 5.

The external digital information supplied by the sapling-and-coding device is transferred to an input 7 of the calculating unit 5 by means of a buffer store 8, which must be read, as will be explained hereinafter, at instants which are suitable for obtaining synchronization of the digital arrangement. To this end a read signal is applied to a terminal 9 of the buffer store 8. The calculating unit 5 provides the processed external information, which is passed to an output terminal 10 of the digital arrangement by means of an And-gate 11. Processing the external information in the calculating unit 5 is done by means of a certain number of coefficients stored in the circulating store 6 and appearing sequentially at an output 12 of this store in a predetermined order, their bits being in series. In the above-mentioned example, in which the digital arrangement is an auto-adaptive equalizer, it is known that the coefficients are periodically incremented and in FIG. 1 the increments of the coefficients, which are assumed to have been calculated somewhere else, appear at a terminal 13 and are applied to an input 14 of the circulating store 6 by means of an And-gate 15.

A clock pulse generator 16 produces the main clock signal H whose frequency determines the rhythm of the bits in the digital arrangement, which frequency is of course high with respect to that of the external clock-pulse signal. The main clock signal H is applied to the clock recovery circuit 2 for synchronizing the leading edges of the external clock pulse signal HE with the leading edges of the main clock signal H. This main clock signal is also applied to the calculating unit 5 and, finally, to a terminal 17 of the circulating store 6 for controlling the appearance of the bits of the coefficients at the output 12 of this store.

For simplicity of the description it is assumed hereinafter that the digital arrangement utilizes five coefficients $A_1$ to $A_5$, each containing three bits $b_1$, $b_2$, $b_3$. In order to achieve that the digital arrangement functions correctly during the data transmission, an operating cycle of the calculating unit 5 must be started after each characteristic transition of the external clock pulse signal HE, which operating cycle comprises a first time interval for entering an external information into the buffer store 8 and a second time interval for having the sequence of the five coefficients $A_1$ to $A_5$ appear at the output 12 of the circulating store 6, starting with the first bit $b_1$ of the first coefficient $A_1$ and ending with the last bit $b_3$ of the last coefficient $A_5$.

Figure 2:
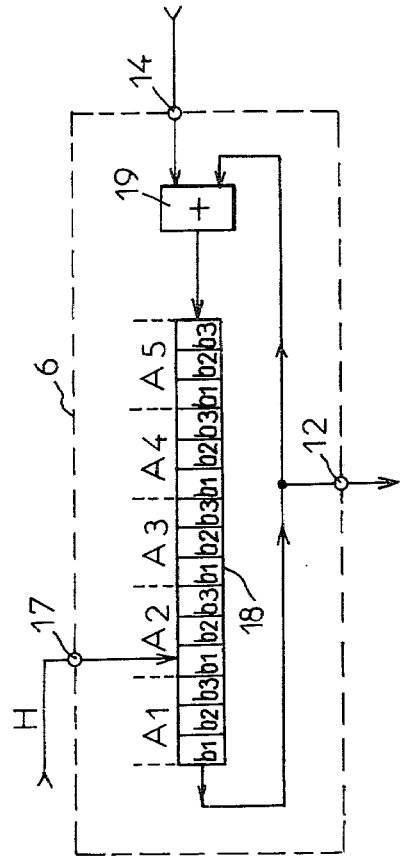
FIG. 2 shows the implementation of a circulating store as used in known synchronizing circuits.

The circulating store 6 may be implemented in the normal way as indicated in FIG. 2, which shows the terminals 12, 14, 17 also shown in FIG. 1. This store comprises a shift register 18 which may be considered as composed of five elementary registers of three elements each in a cascade arrangement, so that this register can store the five coefficients $A_1$ to $A_5$ having 3 bits $b_1$, $b_2$, $b_3$, which coefficients are arranged in the desired order as indicated in FIG. 2. The output of this register 18 is coupled with its input via an input of an adder 19 connected to this input and whose other input is connected to the terminal 14 for receiving the increments of the coefficients. When the main clock signal H is present at the terminal 17 it produces the shift pulses for the register 18 and the coefficients circulate serially in the register and appear at the output 12 of the store 6.

The synchronization of the operating cycles of the calculating unit 5, as discussed in detail above, presents a problem which has not yet been solved in a satisfactory manner when a circulating store 6 is used which is implemented, as shown in FIG. 2, with a shift register 18 of the dynamic type. It is known that with this type of registers utilizing, for example, MOS transistors and associated storage capacitors, the interruptions in the shift pulses must be avoided and these shift pulses must be continuously maintained for high-performance registers, as otherwise there is a risk that the stored information is lost because of inevitable losses in the storage capacitors.

However, a shorter or longer interruption in the shift pulses cannot be avoided in the known synchronizing circuits utilizing a circulating store 6 arranged in the manner shown in FIG. 2.

In a known synchronizing circuit, an operating cycle of constant duration for the calculating unit 5 is started at each characteristic transition of the external clock pulse signal HE which is detected in synchronism with the pulses of the main clock signal H. The shift pulses are interrupted at the end of the second time interval of each operating cycle, that is to say when the last bit $b_3$ of the last coefficient $A_5$ has appeared at the output 12 of the store 6, and they are not reinstated until after the end of the first time interval of the next cycle for having the first bit $b_1$ of the first coefficient $A_1$ appear at the output 12. Thus, during the time interval between two data transmissions, the synchronizing circuit functions with an external clock pulse signal HE whose phase and frequency are poorly defined and, during the transmission of data, with an external clock pulse signal HE in synchronism with the data clock. The duration of the interruption in the shift pulses is therefore approximately equal to the necessary difference between the duration of an operating cycle and the period of the external clock pulse signal HE. To obtain synchronization for a new data transmission, which may occur at any instant of the above-described operation cycle, the duration of the interruption in the shift pulses may even attain a value equal to one period of the external clock pulse signal HE.

On the contrary the present invention provides a circuit which obtains synchronization of the digital arrangement without any interruption of the shift pulses, so that it is possible to utilize the technique of dynamic registers in the circulating store 6 without any restriction, which technique is very advantageous for large scale integration.

Figure 3:
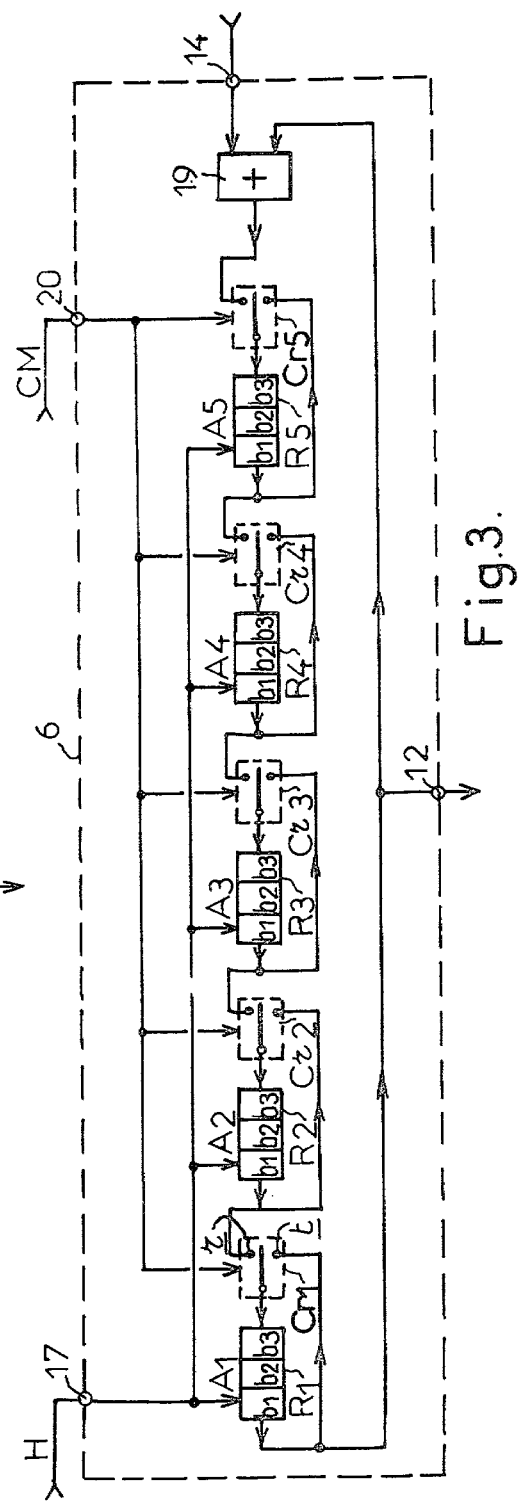
FIG. 3 shows the implementation of a circulating store as used in synchronizing circuits according to the invention.

The synchronizing circuit of the invention utilizes a coefficient store 6 implemented as shown in FIG. 3. A certain number of identical elements in FIGS. 2 and 3 have the same reference numerals. To store five 3-bit coefficients this store is composed of five distinct shift registers $R_1$ to $R_5$, each arranged for containing 3 bits. Arranged between the registers $R_1$ and $R_2$ there is a switch $Cr_1$ which connects the input of the register $R_1$ either to the output of the register $R_2$ or to the output of the register $R_1$, depending on whether it is in the position r or t. Switches $Cr_2$, $Cr_3$, $Cr_4$ having a similar role as $Cr_1$, are arranged respectively between the registers $R_2$ and $R_3$, $R_3$ and $R_4$, $R_4$ and $R_5$. Finally, a switch $Cr_5$ enables connection of the input of the register $R_5$ to either the output of this register or the output of the register $R_1$ by means of the adder circuit 19. The output of the register $R_1$ is connected to the coefficient output 12 of the store 6. The shift pulses of the five registers $R_1$ to $R_5$ are constituted by the main clock signal H appearing at the terminal 17. Finally, the five switches $Cr_1$ to $Cr_5$ are controlled simultaneously by a binary control signal CM appearing at a terminal 20. FIG. 3 shows the content of the store 6 at a given instant at which the registers $R_1$ to $R_5$ contain the 3 bits $b_1$, $b_2$, $b_3$ of the coefficients $A_1$ to $A_5$, respectively. When the control signal CM moves the switches $Cr_1$ to $Cr_5$ to the position r, it will be seen that the assembly of the five registers $R_1$ to $R_5$ arranged in cascade to form a loop behaves like the register 18 in FIG. 2 and the store 6 functions as a circulating store supplying at its output 12 the sequence of five coefficients $A_1$ to $A_5$ during the period of time all these coefficients recirculate. When the control signal CM moves the switches $Cr_1$ to $Cr_5$ to the position t, the output of each register $R_1$ to $R_5$ is fed back to its input and each coefficient consequently circulates in each register; this mode of circulation of the coefficients will be called word-by-word circulation hereinafter.

Figure 4:
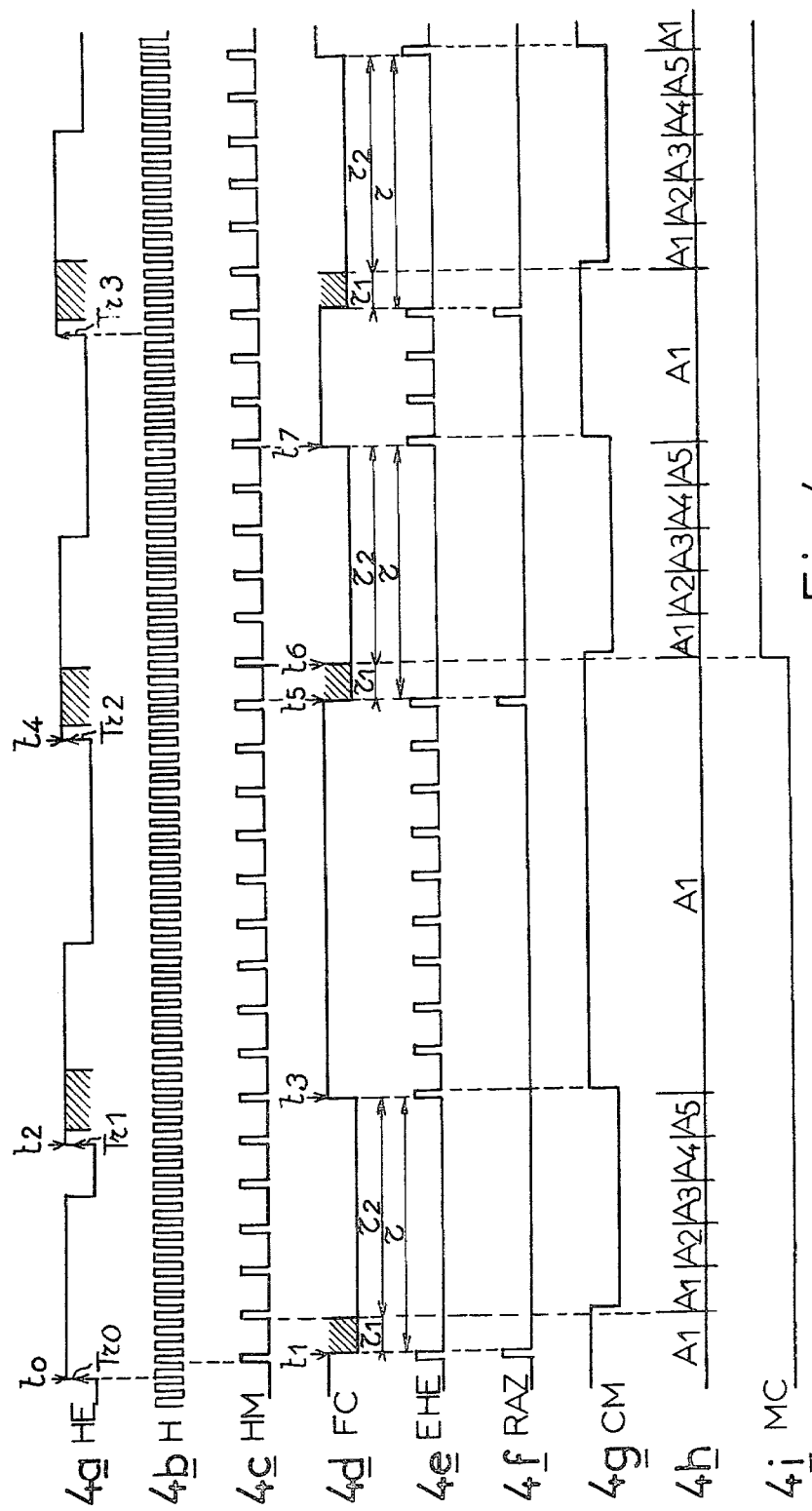
FIG. 4 shows various signal diagrams for the purpose of explaining the operation of the circuit according to the invention.

So the synchronizing circuit in accordance with the invention utilizing a store 6 as shown in FIG. 3 consists of different circuits which are shown in FIG. 1 and whose operation and arrangement will be described with reference to the signal diagrams of FIG. 4.

The diagram 4a represents the external clock pulse signal HE which is applied to the output 3 of the clock recovery circuit 2. The characteristic transitions of this clock pulse signal HE are the ascending transitions provided with arrows. The clock recovery circuit 2 comprises a controllable frequency oscillator 40 which receives the main clock signal H and which is provided in a conventional manner with a phase-locked loop, not shown, for applying an external clock pulse signal HE, whose characteristic transitions are in phase with those of the main clock signal H to the output terminal 3. If no signal at all is received at terminal 1, the oscillator 40 produces a signal HE whose frequency and phase are not controlled in any other way. In addition, the clock recovery circuit 2 comprises means for achieving the synchronization of the external clock pulse signal HE to the data clock, from the moment a data signal appears at the terminal 1 during a new transmission. This means consists of a circuit 41 which detects the transitions of the signal received at the terminal 1 and a circuit 42 which immediately detects whether a data signal is received at the terminal 1 and produces a rapid synchronization signal SR in that case. The circuit 41 detects first of all the transitions of the data clock signal transmitted before the actual data transmission, thereafter the transitions of the data signal during the transmission. The signals produced by the circuits 41 and 42 are applied to the controllable frequency oscillator 40 which then produces an external clock pulse signal HE which is synchronous with the data clock from the instant a data signal appears at the terminal 1. The point $t_2$ in diagram 4a represents such an instant. Prior to the instant $t_2$, the external clock pulse signal HE for which the characteristic transition $Tr_0$ produced at instant $t_0$ is indicated in FIG. 4, has any phase. At the instant $t_2$ at which the data transmission starts, the external clock pulse signal HE changes its phase abruptly and shows the characteristic transition $Tr_1$, which is synchronous with the data clock. After the instant $t_2$ during the data transmission the external clock pulse signal HE shows successively the characteristic transitions $Tr_2$, $Tr_3$, ... etc. The hatched areas of diagram 4a represent the time intervals following the characteristic transitions $Tr_1$, $Tr_2$, $Tr_3$, ... etc., during which the data received at the terminal 1, encoded in the sampling-and-coding device 4 and thereafter transferred to the buffer store 8 must be entered into this buffer store 8.

The main clock signal H produced by the generator 16 is shown in diagram 4b. Its ascending transitions are used as shift pulses in the registers constituting the store 6 and are also used, as explained above, for synchronizing the external clock pulse signal HE produced by the oscillator 40.

The main clock signal H is also applied to a pulse counter 21 which is arranged as a frequency divider and which produces the word clock signal HM shown in diagram 4c. One period of the word clock signal HM is equal to the time required to circulate one coefficient in one of the registers $R_1$ to $R_5$ constituting the store 6. In the chosen example where the coefficient consists of three bits, one period of the word clock signal HM is equal to three periods of the main clock signal H.

The word clock signal HM is applied to a pulse counter 22 which is reset to zero by a pulse of a reset signal (RAZ) applied to its terminal 23 and which counts a certain number of word clock pulses until it has attained its final position. Thereafter this counter 22 remains in this final position until appearance of the next pulse of the reset signal which is produced as will be explained hereinafter. At an output 24 of counter 22 an end-of-cycle signal FC is obtained, which indicates that the final position has been reached. This signal FC is shown in diagram 4d. At instants such as $t_1$, $t_5$, which coincide with the descending transitions of certain pulses of the signal HM, the counter 22 is reset to zero and the signal FC becomes equal to "0". Thereafter, the counter 22 counts the ascending transitions of the word clock signal HM and the signal FC remains equal to "0" until the instant that the counter arrives in its final position, corresponding to 6 counted transistions in this present example. At instants such as $t_3$ to $t_7$ the signal FC becomes equal to "1". The time intervals during which the signal FC has the value "0" have the same duration $\tau$, which is equal to the duration of one operating cycle of the calculating unit 5. In view of the above, it will be clear that an operating cycle does not stop until its very end once it has been started. In each of these operating cycles there is a distinct first time interval of duration $\tau_1$ indicated as a hatched zone in diagram 4d and extending from the instant at which the counter 22 is reset to zero to the instant at which the first ascending transition of the word clock signal HM appears at the input of the counter 22. The counter 22 comprises an appropriate decoding circuit to produce at its output terminal 25 a signal which controls the read procedure of an external information into the buffer store 8 during each time interval $\tau_1$. Each operating cycle comprises a second time interval of duration $\tau_2$ which extends from the instant at which the counter 22 counts a first ascending transition of the word clock signal HM to the instant at which this counter reaches its final position which, in this example, corresponds to 6 ascending transitions of the word clock signal. Each duration $\tau_2$ has a value corresponding to five word clock periods and the sequence of five coefficients $A_1$ to $A_5$ appears at the output 12 of the store 6 during these time intervals of duration $\tau_2$ in order to be utilized in the processing of the external information read during the interval $\tau_1$. Later in this description it will be explained how the signal CM appearing at an output 26 of the counter 22 is obtained to control in an appropriate manner the circulation of the coefficients in the registers of the store 6.

It will now be explained how the zero reset signal is produced which is applied to the terminal 23 of the counter 22 for resetting this counter to zero after it has reached its final position, that is to say when the end-of-cycle signal FC is equal to "1". To obtain this zero reset signal RAZ the word clock signal HM and the end-of-cycle signal FC are applied to the And-gate 27 which produces a signal EHE shown in diagram 4e. This signal EHE comprising the pulses of the word clock signal HM outside the operating cycles is applied to a circuit 28 for detecting transitions in one predetermined direction, which circuit 28 also receives the external clock pulse signal HE. In the transition detection circuit 28 the signal EHE is used to sample the external clock pulse signal HE and at each characteristic transition of the external clock pulse signal HE it passes a pulse of the signal EHE to the output 29 of the transition detection circuit 28. The signal obtained at this output 29 is shown in diagram 4f; it constitutes the zero reset signal RAZ applied to the terminal 23 of counter 22 for resetting this counter to zero, this resetting procedure being controlled by the descending transitions of the signal RAZ at instants such as $t_1$ and $t_5$.

Diagram 4g shows the signal CM which is produced at the output 26 of counter 22 and must be applied to the terminal 20 of the store 6 in order to control, as shown in FIG. 3, the switches $Cr_1$ to $Cr_5$, that is to say the mode of circulation of the coefficients in the registers $R_1$ to $R_5$. The signal CM is equal to "0" during time intervals of duration $\tau_2$, which are delayed over the width of one pulse with respect to the intervals of the same duration $\tau_2$ of the diagram 4d. Taking account of the explications given above with reference to diagram 4d, it is easy to see how the signal CM is produced. In each of the time intervals $\tau_2$ in which the signal CM is equal to "0" the switches $Cr_1$ to $Cr_5$ of buffer store 6 are in the position r so that the five coefficients $A_1$ to $A_5$ circulate in series in the registers $R_1$ to $R_5$ and appear successively at the output 12 of the store 6, their bits $b_1$, $b_2$, $b_3$ being in series. As shown in diagram 4h, the appearance of the five coefficients in series at the output 12 occurs during the intervals of duration $\tau_2$, shown in diagram 4d, starting with the first bit $b_1$ of the first coefficient $A_1$ and ending with the last bit $b_3$ of the last coefficient $A_5$. This signal CM has the value "1" during time intervals whose variable duration is always a multiple of one word clock period. During these time intervals in which the signal CM is equal to "1", the switches $Cr_1$ to $Cr_5$ are in the position t, so that the coefficients $A_1$ to $A_5$ circulate word-by-word, that is to say each in a respective one of the registers $R_1$ to $R_5$, and only the 3 bits $b_1$, $b_2$, $b_3$ of the coefficient $A_1$ appear at the output 12 of the store 6. As shown in diagram 4h this appearance of the coeffient $A_1$ at the output 12 occurs during the time intervals outside the intervals of duration $\tau_2$, shown in diagram 4d, starting with the first bit $b_1$ of the coefficient $A_1$ and ending with the last bit $b_3$ of this coefficient $A_1$.

Finally, diagram 4a shows the signal MC which is produced in a circuit 30 and applied on the one hand to the AND-gate 15 to allow the modification of the coefficients in the store 6 by the increments appearing at the terminal 13 and, on the other hand, to the AND-gate 11 to allow the transfer of the information produced by the calculating unit 5 to the output terminal 10 of the digital arrangement. The state of this signal MC changes from "0" to "1" when the digital arrangement is in synchronism, that is to say when, after reception of a data signal at the terminal 1 for a new data transmission, the sequence of five coefficients $A_1$ to $A_5$ begins to appear at the output 12 of the store 6. From the above explanations it follows that the circuit 30 may be implemented, for example, by means of a flipflop whose state is changed at the end of the read signal for the buffer store 8 appearing at the terminal 25 of the counter 22, which change does not take place until after the appearance of the rapid synchronizing signal SR at the output of the signal detector 42.

The operation of the overall synchronizing circuit of the invention will now be described with reference to the diagrams of FIG. 4. Prior to the instant $t_2$ no data signal appears at the input terminal 1 and after the characteristic transition $Tr_0$ at the instant $t_0$ of the external clock pulse signal HE no external information is coded by the sampling- and- coding circuit 4 and transferred to the buffer store 8. But, owing to the procedure described above, the transition $Tr_0$ starts an operating cycle of a duration $\tau$ which begins at the instant $t_1$ and ends at the instant $t_3$ and which is expressed by a value "0" of the signal FC. As shown in diagram 4a the coefficients in the store 6 circulate word-by-word prior to the instant $t_0$ and during the interval of duration $\tau_1$ of the cycle; thereafter they circulate in series until the instant $t_3$ of the end of the cycle. Assuming that the signal MC (diagram 4i) is equal to "0" the coefficients circulating in the store 6 are not modified and any information produced by the calculating unit 5 is not taken into account.

When a data signal appears at the input terminal 1, the rapid synchronizing signal SR produced by the signal detector 42 determines the appearance of the characteristic transition $Tr_1$ of the external clock pulse signal HE at the instant $t_2$, which transition $Tr_1$ is in synchronism with the data clock and occurs, for example, during the cycle between $t_1$ to $t_3$. After this transition $Tr_1$ an external information is coded in the sampling-and-coding circuit 4 and transferred to the buffer store 8, where it can only be read during the time interval following the transition $Tr_2$ and shown in diagram 4a in the form of a hatched area.

After the instant $t_3$ at which the first cycle, described above, ends the coefficients in the store 6 circulate word-by-word and a new cycle will not be started until after the appearance of the characteristic transition $Tr_2$ of the signal HE at the instant $t_4$. The transition $Tr_2$ starts the coding of a second external information which is transferred to the buffer store 8. Detecting the transition $Tr_2$ by means of the above-described procedure starts a second cycle of duration $\tau$ which begins at the instant $t_5$, ends at the instant $t_7$ and is expressed by a value "0" for the signal FC. During the first time interval $\tau_1$ of the second cycle the coefficients circulate again word-by-word, which first interval $\tau_1$ ends at the instant $t_6$. During this time interval $\tau_1$ the external information which was coded after the transition $Tr_1$ and entered into the buffer store 8 is read from this store in order to be directed to the calculating unit 5. Starting at the instant $t_6$ and until the end $t_7$ of the second cycle the coefficients circulate in series in the store 6 and appear in this form at the output 12 to be directed to the calculating unit 5. The signal MC becomes equal to "1", also from the instant $t_6$, so that the coefficients in the store 6 can be modified and the information processed by the calculating unit 5 may be taken into account.

New operating cycles of the calculating unit 5 are effected in the same manner after the end $t_7$ of the second cycle, each new cycle being started by a characteristic transition of the external clock pulse signal HE, the signal MC remaining equal to "1" to allow the modification of the coefficients and to take the processed information into account.

It is obvious that with the synchronizing circuit described above the shift pulses in the registers forming the store 6 are never interrupted, which makes it possible to use registers of the dynamic type which can be implemented very easily in large scale integration techniques. But the circuit according to the invention can also be used advantageously with circulating stores composed of static flipflop registers for it offers in any case the advantage that it is very rapid in acquiring synchronization, in fact within less than one period of the external clock pulse signal HE. In addition, this circuit adapts itself automatically to any frequency of the external clock pulse signal, provided that the predetermined duration of an operating cycle is shorter than the period of this external clock pulse signal.

The invention has been described for the case where it is used in a data transmission receiver in order to synchronize a digital arrangement such as an equalizer. However, it will be evident that it can also be used for any other digital processing arrangement, which receives the information to be processed in a rhythm independent of its internal clock signal.

What is claimed is:

1. A circuit for synchronizing a digital arrangement with an external clock pulse signal, the digital arrangement having a calculating unit receiving during each one of its cycles to be synchronized with the external clock pulse signal both an external information to be entered into a buffer store and, thereafter, a sequence of coefficients originating in a predetermined order from a circulating store formed by a number of shift registers equal to the number of coefficients, these shift registers being shifted by pulses derived from a main clock generator, said synchronizing circuit comprising:

switching means included in said circulating store for having the coefficients circulate in series in the cascade-connected registers, word by word, each coefficient being one word length;

means for deriving from said main clock generator a word clock corresponding to the duration of circulation of a coefficient in a register;

means for forming in synchronism with the word clock, operating cycles of constant duration for said calculating unit and a read signal for said buffer store at the beginning of each cycle;

a transition detection circuit to start each cycle arranged for detecting at the occurrence of a word clock pulse the characteristic transition of the external clock pulse signal appearing after the end of each cycle;

said switching means being controlled so that said coefficients circulate word-by-word from the end of each cycle to the instant at which within the next cycle said buffer store has been read and that thereafter said sequence of coefficients circulates in series until the end of said next cycle.

2. A circuit as claimed in claim 1, further comprising:
means for forming the operating cycles of said calculating unit;

said means comprising:

a word clock pulse counter which is reset to zero by the pulses of a zero reset signal and which counts until it has attained its final position a predetermined number of word clock pulses corresponding to the duration of one cycle;

the pulses of the zero reset signal being obtained from the output of said circuit for detecting transitions in a predetermined direction in which the external clock pulse signal is sampled by means of the pulses produced by an AND-gate receiving the pulses of the word clock and an end-of-cycle signal indicating that the final position of the counter has been reached;

said counter being provided with decoding means for forming the read signal for said buffer store from the instant at which the counter is reset to zero to the instant at which it attains an intermediary position and for controlling said switching means of said circulating store so that said coefficients circulate word-by-word from each instant at which said counter attains it final position at the end of a cycle to the instant at which it attains said intermediate position in the next cycle and said predetermined sequence of coefficients circulates in series between the instants at which said counter attains said intermediate position and its final position in each cycle.

3. A circuit as claimed in claims 1 or 2, wherein said circulating store is composed of shift registers of the dynamic type.

4. A receiver of a data transmission system having a data clock recovery circuit producing said external clock pulse signal, a sampling-and-coding circuit producing coded samples of a received data signal for transfer to a buffer store, a digital arrangement for processing said coded samples by means of coefficients supplied by a circulating store, said digital arrangement having the synchronization circuit as claimed in claims 1 or 2, wherein said recovery circuit comprises:

a controllable frequency oscillator which continuously produces an external clock pulse signal;

a circuit for detecting the transitions in the received data signal; and a data signal detection circuit for producing a characteristic with the data clock as soon as a data signal is received.

5. A receiver as claimed in claim 4, provided with a digital arrangement using adjustable coefficients, further comprising a circuit arranged for detecting the instant at which the first serial circulation of the sequence of coefficients is started subsequent to the appearance of a data signal at the input of the receiver and for allowing the modification of the coefficients and for taking the processed information into account from that instant onwards.

* * * * *